(12) United States Patent
Melanson (10) Patent No.: US 7,138,934 B2
(45) Date of Patent: Nov. 21, 2006

(54) PATTERN BIASING FOR LOOK-AHEAD DELTA SIGMA MODULATORS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/043,720

(22) Filed: Jan. 26, 2005

(65) Prior Publication Data

US 2005/0162286 A1 Jul. 28, 2005

Related U.S. Application Data

(60) Provisional application No. 60/539,132, filed on Jan. 26, 2004, provisional application No. 60/588,951, filed on Jul. 19, 2004.

(51) Int. Cl.
*H03M 3/00* (2006.01)
(52) U.S. Cl. ........................ 341/143; 341/144; 341/155
(58) Field of Classification Search ................. 341/143
See application file for complete search history.

(56) References Cited

U.S. PATENT DOCUMENTS

| | | | |
|---|---|---|---|
| 5,548,286 A * | 8/1996 | Craven | 341/126 |
| 5,550,544 A | 8/1996 | Sakiyama et al. | 341/155 |
| 5,585,801 A | 12/1996 | Thurston | 341/143 |
| 5,598,159 A * | 1/1997 | Hein | 341/143 |
| 5,708,433 A * | 1/1998 | Craven | 341/144 |
| 5,742,246 A | 4/1998 | Kuo et al. | 341/143 |
| 5,757,300 A | 5/1998 | Koilpillai et al. | 341/143 |
| 5,757,517 A | 5/1998 | Couwenhoven et al. | 358/463 |
| 5,786,779 A | 7/1998 | Chun et al. | 341/61 |
| 5,977,899 A | 11/1999 | Adams | 341/145 |
| 6,067,515 A | 5/2000 | Cong et al. | 704/243 |
| 6,070,136 A | 5/2000 | Cong et al. | 704/222 |
| 6,112,218 A | 8/2000 | Gandhi et al. | 708/320 |
| 6,160,505 A | 12/2000 | Vaishampayan | 341/143 |

(Continued)

FOREIGN PATENT DOCUMENTS

EP 0512687 11/1992

(Continued)

OTHER PUBLICATIONS

Angus, James A.S., "Tree Based Lookahead Sigma Delta Modulators," Audio Engineering Society 114th Convention, Convention Paper 5825, Mar. 22-25, 2003, pp. 1-8.

(Continued)

*Primary Examiner*—Rexford Barnie
*Assistant Examiner*—Khai M. Nguyen
(74) *Attorney, Agent, or Firm*—Hamilton & Terrile, LLP; Kent B. Chambers (57) ABSTRACT

Look-ahead delta sigma modulators of a signal processing system can selectively bias one or more output candidate vectors to alter the probability of selecting a biased output candidate vector(s) for determination of a quantization output value. The probability, within a range of error, of certain output candidate vectors being selected by a quantizer of the look-ahead delta sigma modulator can be determined. The output candidate vectors determine the quantization output values. Thus, altering the probability of selecting a certain output candidate(s) alters the probability of occurrence of a certain quantization output value(s). Detection of the altered probability allows an output signal to be identified. Identifying an output signal allows for many interesting operations including identifying a specific signal processing system source of the output signal and modifying processing of the output signal. Additionally, some quantization output values can be compressed more densely than others.

24 Claims, 8 Drawing Sheets

U.S. PATENT DOCUMENTS

| | | | |
|---|---|---|---|
| 6,177,897 B1 | 1/2001 | Williams, III | 341/150 |
| 6,232,899 B1 | 5/2001 | Craven | 341/126 |
| 6,310,518 B1 | 10/2001 | Swanson | 330/282 |
| 6,313,773 B1 | 11/2001 | Wilson et al. | 341/143 |
| 6,347,297 B1 | 2/2002 | Asghar et al. | 704/243 |
| 6,362,769 B1 | 3/2002 | Hovin et al. | 341/157 |
| 6,373,416 B1 | 4/2002 | McGrath | 341/143 |
| 6,392,576 B1 | 5/2002 | Wilson et al. | 341/143 |
| 6,418,172 B1 | 7/2002 | Raghavan et al. | 375/262 |
| 6,480,129 B1 | 11/2002 | Melanson | 341/143 |
| 6,480,528 B1 | 11/2002 | Patel et al. | 375/148 |
| 6,501,404 B1 | 12/2002 | Walker | 341/143 |
| 6,590,512 B1 | 7/2003 | Roh et al. | 341/143 |
| 6,639,531 B1 | 10/2003 | Melanson | 341/143 |
| 6,724,332 B1 | 4/2004 | Melanson | 341/143 |
| 6,760,573 B1 | 7/2004 | Subrahmanya et al. | 455/192.2 |
| 6,822,594 B1 * | 11/2004 | Melanson et al. | 341/143 |
| 6,842,128 B1 | 1/2005 | Koh | 341/143 |
| 6,842,486 B1 | 1/2005 | Plisch et al. | 375/247 |
| 6,861,968 B1 | 3/2005 | Melanson | 341/143 |
| 6,873,278 B1 | 3/2005 | Ferguson et al. | 341/144 |
| 6,873,280 B1 | 3/2005 | Robinson et al. | 341/159 |
| 6,879,275 B1 | 4/2005 | Melanson | 341/143 |
| 6,888,484 B1 | 5/2005 | Kiss et al. | 341/143 |
| 6,933,871 B1 | 8/2005 | Melanson | 341/143 |
| 6,940,434 B1 | 9/2005 | Brooks | 341/131 |
| 6,956,514 B1 | 10/2005 | Melanson et al. | 341/143 |
| 6,967,606 B1 | 11/2005 | Wiesbauer et al. | 341/143 |
| 2003/0086366 A1 | 5/2003 | Branlund et al. | 370/208 |
| 2003/0231729 A1 | 12/2003 | Chien et al. | 375/376 |
| 2005/0012649 A1 | 1/2005 | Adams et al. | 341/143 |
| 2005/0052300 A1 | 3/2005 | Ranganathan | 341/143 |

FOREIGN PATENT DOCUMENTS

| | | |
|---|---|---|
| EP | 1227595 | 7/2002 |
| JP | 2003-124812 | 4/2003 |

OTHER PUBLICATIONS

Harpe, Pieter, et al., "Efficient Trellis-Type Sigma Delta Modulator," Audio Engineering Society 114th Convention, Convention Paper 5845, Mar. 22-25, 2003, pp. 1-8.

Hawksford, M.O.J., "Parametrically Controlled Noise Shaping in Variable State-Step-Back Pseudo-Trellis SDM," Audio Engineering Society 115th Convention, Convention Paper, Oct. 10-13, 2003, pp. 1-14.

Kato, Hiroshi, "Trellis Noise-Shaping Converters and 1-bit Digital Audio," Audio Engineering Society 112th Convention, Convention Paper 5615, May 10-13, 2003, pp. 1-9.

Sony Electronics, Inc. and Philips Electronics N.V., "Super Audio Compact Disc, A Technical Proposal," 1997, pp. 2-11, unknown month.

Paulos, John J. et al., "Improved Signal-To-Noise Ratio Using Tri-Level Delta-Signa Modulation," Reprinted from IEEE Proc. ISCAS, May 1987, pp. 245-248.

Knapen, Eric et al., "Lossless Compression of 1-Bit Audio," J. Audio Eng. Soc., vol. 52, No. 3, Mar. 2004, pp. 190-199.

Zetterberg, L.H. et al., "Adaptive Delta Modulation with Delayed Decision," IEEE Transactions on Communications, IEEE vol. COM-22, No. 9, Sep. 1974, pp. 1195-1198.

Stonick, J.T. et al., "Look-Ahead Decision-Feedback $\Sigma \Delta$ Modulation," IEEE International Conference on Acoustics, Speech and Signal Processing, New York, 1994, pp. 541-544, unknown month.

Abeysekera, S. et al., "Design of Multiplier Free FIR Filters Using a LADF Sigma-Delta Modulator," Circuits and Systems, 2000, Proceedings, ISCAS 2000 Geneva, The 2000 IEEE International Symposium, May 28-31, 2000, vol. 2, May 28, 2000, pp. 65-68.

Abeysekera, S.S. et al., "Performance Evaluation of $3^{rd}$ Order Sigma-Delta Modulators via FPGA Implementation," ASIC/SOC Conference, 2001, Proceedings, 14th Annual IEEE International Sep. 12-15, 2001, pp. 13-17.

Magrath, A.J. et al., "Performance Enhancement of Sigma-Delta Modulator D-A Converters Using Non-Linear Techniques," 1996 IEEE Symposium on Circuits and Systems (ISCAS), vol. 2, May 12, 1996, pp. 277-280.

Magrath, A.J. et al., "Non-Linear Deterministic Dithering of Sigma-Delta Modulators," IEE Colloquium on Oversampling and Sigma Delta Strategies for DSP, 1995, pp. 1-6, unknown month.

Linfors, S., "A Two-Step Quantization $\Delta \Sigma$-Modulator Architecture with Cascaded Digital Noise Cancellation," Electronics, Circuits and Systems, 2000, ICECS, The 7th IEEE International Conference, Dec. 17-20, 2000, vol. 1, pp. 125-128.

Harris, F.J. et al., "Implementation Considerations and Limitations for Dynamic Range Enhanced Analog to Digital Converters," IEEE International Conference on Acoustics, Speech and Signal Processing, May 23, 1989, pp. 1286-1289.

Fang, L. et al., "A Multi-Bit Sigma-Delta Modulator with Interstate Feedback," Circuits and Systems, 1998, Proceedings of the 1998 IEEE International Symposium, May 31-13 Jun. 3, 1998, vol. 1, pp. 583-586.

* cited by examiner

PATTERN BIASING FOR LOOK-AHEAD DELTA SIGMA MODULATORS

CROSS-REFERENCE TO RELATED APPLICATIONS

This application claims the benefit under 35 U.S.C. § 119(e) of (i) U.S. Provisional Application No. 60/539,132, filed Jan. 26, 2004 and entitled "Signal Processing Systems with Look-Ahead Delta-Sigma Modulators" and (ii) U.S. Provisional Application No. 60/588,951, filed Jul. 19, 2004 and entitled "Signal Processing Systems with Look-Ahead Delta-Sigma Modulators". Provisional applications (i) and (ii) include example systems and methods and are incorporated by reference in their entireties.

BACKGROUND OF THE INVENTION

1. Field of the Invention

The present invention relates in general to the field of information processing, and more specifically to a system and method for biasing output candidate vectors used to generate an output signal.

2. Description of the Related Art

Figure 1:
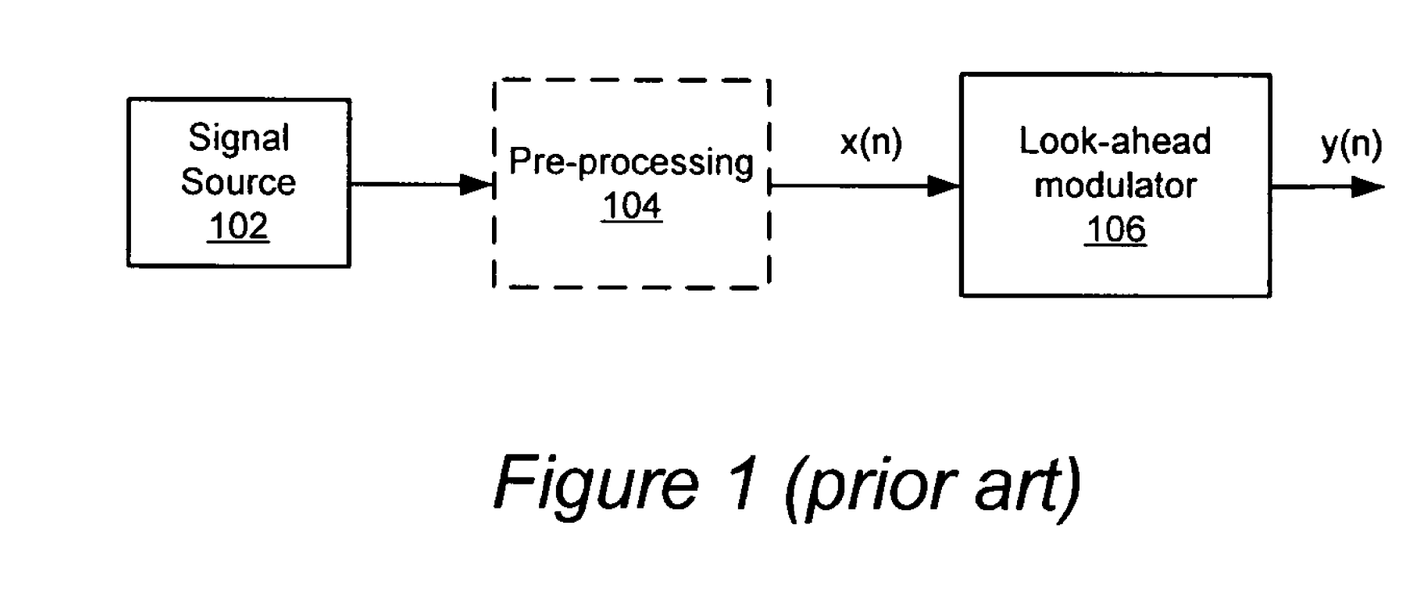
FIG. 1 (prior art) depicts a signal processing system with a conventional look-ahead delta-sigma modulator.

A few signal processing systems implement look-ahead delta-sigma modulators in an attempt to obtain superior input/output signal fidelity by minimizing long term error. "Delta-sigma modulators" are also commonly referred to using other interchangeable terms such as "sigma-delta modulators", "delta-sigma converters", "sigma delta converters", and "noise shapers". FIG. 1 depicts a prior art signal processing system 100 having a look-ahead delta-sigma modulator 102.

The signal source 102 provides an input signal to preprocessing components 104. Preprocessing components include an analog-to-digital converter ("ADC") and oversampling components to generate a k-bit, digital input signal x(n). For audio applications, x(n) generally represents a signal sampled at 44.1 kHz times an oversampling ratio, such as 64:1. Look-ahead modulator 106 quantizes input signal x(n) and shapes the quantization noise so that most of the quantization noise is moved out of the signal band of interest, e.g. approximately 0–20 kHz for audio applications. Each output signal y(n) (also referred to herein as an "output value") generally has one of two values selected from the set $\{+\Delta/2, -\Delta/2\}$ with "$\Delta$" representing the full swing of y(n). (For convenience, $\Delta/2$ will be represented as $+1$, and $-\Delta/2$ will be represented as $-1$.). The output signal y(n) can be further processed and, for example, used to drive an audio sound system or can be recorded directly onto a storage medium.

Figure 2:
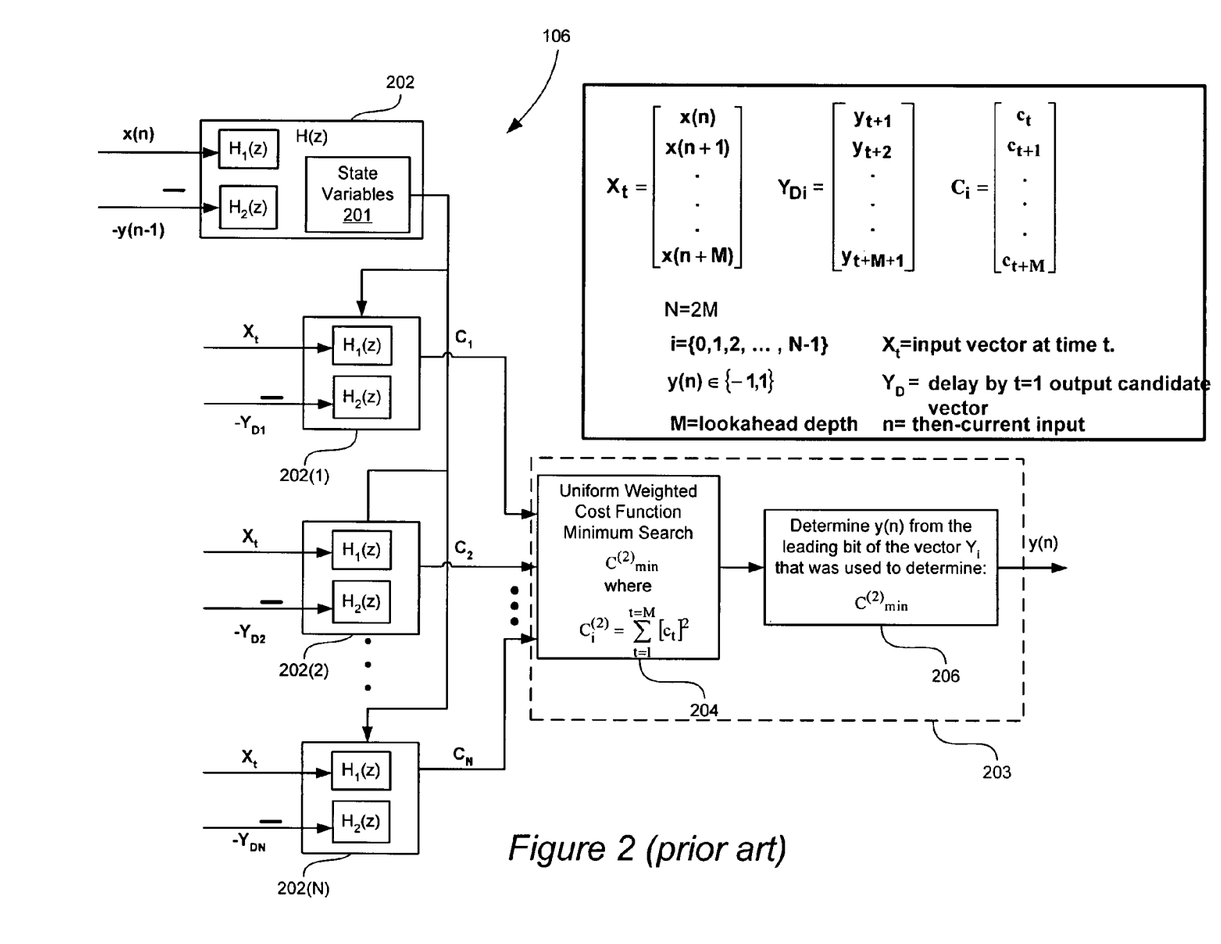
FIG. 2 (prior art) depicts exemplary data used by the look-ahead delta-sigma modulator of FIG. 1 to determine an output signal.

FIG. 2 depicts a schematic representation of prior art look-ahead delta-sigma modulator 106 with a look-ahead depth of M. Table 1 describes an embodiment of the symbols used in FIG. 2.

TABLE 1

| Symbol | Definition |
| --- | --- |
| x(n) | The nth discrete input signal. |
| $X_t$ | Input signal vector at a time t. |
| y(n) | The nth discrete output signal. |
| $Y_{Di}$ | The ith output delayed by one candidate vector. |
| $C_i$ | The ith cost value vector = $H(D_i(z))$. |
| M | Look-ahead depth. |

TABLE 1-continued

| Symbol | Definition |
| --- | --- |
| N | N = $k^M$ = The number of output signal candidate sets under consideration, and k = number of possible values for y(n). |
| i | i is selected from the set $\{0, 1, 2, \ldots N - 1\}$. |
| $C^{(2)}_i$ | The ith cost value power. |
| $C^{(2)}_{min}$ | The minimum cost value power at time t. |

The look-ahead depth M refers to the dimension of each delayed output candidate vector $Y_{Di}$ used to determine output signal y(n). For time t, a negative delayed output candidate vector $-Y_{Di}$, $i \in \{0,1,2,\ldots, N-1\}$ and the input vector $X_t$ are inputs to noise shaping filter 202(i). For a look-ahead depth of M and y(n)=$\{-1, +1\}$, and without pruning output candidates, each of the N delayed output candidate vectors contains a unique set of elements. Each noise-shaping filter 202(i) of look-ahead delta-sigma modulator 106 uses a common set of filter state variables for time t during the calculations of respective cost value vectors $C_i$. Filter 202 maintains the actual filter state variables used during the calculation of each y(n). The state variables are updated with the selected y(n) output value. Loop filter 202 processes $X_t$ and $-Y_i$ to produce an error value, which in this embodiment is referred to as cost value vector $C_i$. Cost value vector $C_i$, and, thus, each element of cost value vector $C_i$ is a frequency weighted error value. In some embodiments of look-ahead delta-sigma modulator 106, input signal vector $X_t$ and delayed output candidate vectors $Y_{Di}$ are also used as direct inputs to filter 202(i).

Quantizer error and output generator 203 includes two modules to determine y(n). The cost function minimum search module 204 computes the cost value power, $C_i^{(2)}$, of each cost value vector $C_i$ in accordance with Equation 1, and determines the minimum cost value power at time t.

$$C_i^{(2)} = \sum_{t=1}^{t=M} [c_t]^2. \quad \text{Equation 1}$$

"$c_t$" represents a cost value for time t, t=1 through M, in the cost vector $C_i$. Thus, the cost function minimum search module 204 of quantizer 203 attempts to minimize the energy out of loop filter 202. Minimizing the energy out of loop filter 202 effectively drives the input $C_i$ to a small value, which effectively results in a relatively high loop gain for look-ahead delta-sigma modulator 106 and, thus, modifies the noise shaping transfer function in an undesirable way.

The y(n) selector module 206 selects y(n) as the leading bit of $Y_i$ where $C_i^{(2)}$ min represents the minimum cost value power.

For example, if M=2 and y$\in\{-1,+1\}$, then N=4, $i \in \{0,1,2,3\}$, and Table 2 represents each of the Y output candidate vectors and $X_t$.

TABLE 2

|  | $Y_1$ | $Y_2$ | $Y_3$ | $Y_4$ | $X_t$ |
| --- | --- | --- | --- | --- | --- |
| $y_t$ | 0 | 0 | 1 | 1 | x(n) |
| $y_{t+1}$ | 0 | 1 | 0 | 1 | x(n + 1) |

If $C_3^{(2)}$ represents the minimum cost value power, then selector module 206 selects y(n)=1 because the first bit in output candidate vector $Y_3$ (the output candidate vector associated with $C_3^{(2)}$), equals 1. If $C_1^{(2)}$ represents the minimum cost value power, then selector module 206 selects y(n)=0 because the first bit in output candidate vector $Y_1$ (the output candidate vector associated with $C_1^{(2)}$), equals 0.

Conventional research in look-ahead modulators primarily involves two threads. The first are the works of Hiroshi Kato, "Trellis Noise-Shaping Converters and 1-bit Digital Audio," AES 112$^{th}$ Convention, May 10–13, 2002 Munich, and Hiroshi Kato, Japanese Patent JP, 2003-124812 A, and further refinements described in Harpe, P., Reefman D., Janssen E., "Efficient Trellis-type Sigma Delta Modulator," AES 114$^{th}$ Convention, 2003 Mar. 22–25, Amsterdam (referred to herein as "Harpe"); James A. S. Angus, "Tree Based Look-ahead Sigma Delta Modulators," AES 114$^{th}$ Convention, 2003 Mar. 22–25, Amsterdam; James A. S. Angus, "Efficient Algorithms for Look-Ahead Sigma-Delta Modulators," AES 155$^{th}$ Convention, 2003 Oct. 10–13, New York; Janssen E., Reefman D., "Advances in Trellis based SDM structures," AES 115$^{th}$ Convention, 2003 Oct. 10–13, New York. This research targets solving the problems of 1-bit encoding of audio data for storage without using the steep anti-alias filters associated with pulse code modulation "PCM." The advent of super audio compact disc "SACD" audio storage, with its moderate oversampling ratios (32 or 64), motivated this work.

The second primary thread of look-ahead modulator research involves pulse width modulation ("PWM") amplifiers based on delta-sigma modulators combined with digital PWM modulation stages. The principal researchers have been Peter Craven and John L. Melanson. In U.S. Pat. No. 5,784,017 entitled "Analogue and Digital Converters Using Pulse Edge Modulations with Non-Linear Correction," inventor Peter Craven ("Craven"), which is incorporated herein by reference in its entirety, Craven described the use of look-ahead delta-sigma modulators. The purpose of Craven was to ensure stability in alternating edge modulation, an inherently difficult modulation mode to stabilize. In the PWM case, the delta-sigma modulator is operating at a low oversampling ratio (typically 4–16), and quantization noise is a special problem.

Conventional technology has not proposed a reasonable way to find the closest matching output signal sets for each time t directly given that, without pruning, there are $2^M$ possible reasonable combinations to search and the length of output signals Y[n] for a 1 minute signal is 60*44100*64 (i.e., 60 seconds, 44.1 kHz sampling frequency, and 64:1 oversampling ratio). Trellis searches, tree searches, and pruning have all been proposed as solutions to reducing the computation.

Figure 3:
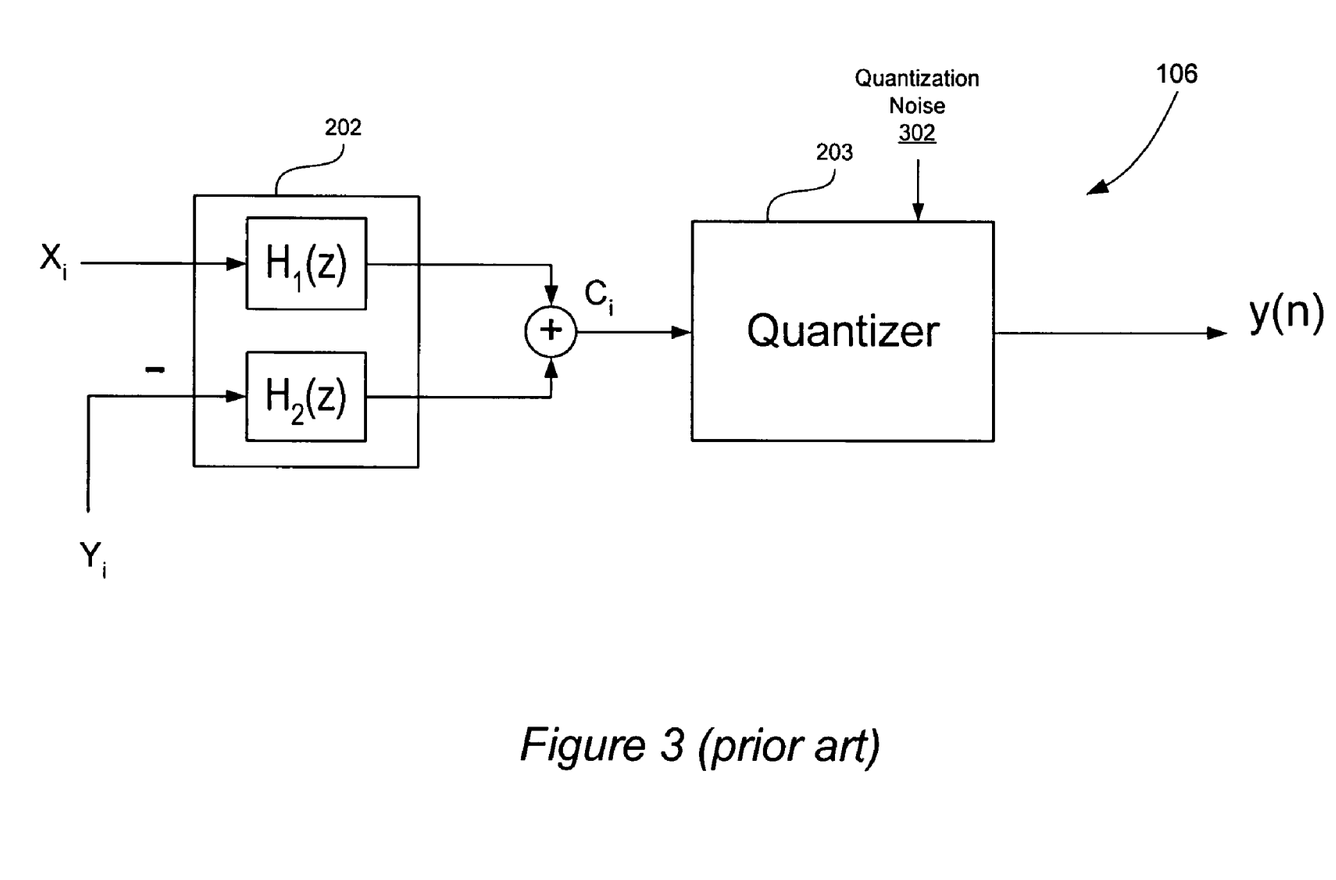
FIG. 3 (prior art) depicts a model of the look-ahead modulator of FIG. 1 that includes a model of a noise shaping filter.

FIG. 3 depicts a model of a loop filter 202 as a composite of two (2) transfer functions $H_1(z)$ and $H_2(z)$, a noise transfer function ("NTF") and a separate signal transfer function ("STF"), as described in the background section of commonly assigned U.S. patent application Ser. No. 10/900, 877, filed Jul. 28, 2004, entitled "Signal Processing with Lookahead Modulator Noise Quantization Minimization", inventor John L. Melanson (referred to herein as the "Melanson I Patent") and in chapter 4 of Norsworthy et al, "Delta Sigma Data Converters—Theory, Design, and Simulation". 1997, ISBN 0-7803-1045-4. The feedback of output candidate vector $Y_{Di}$ introduces quantization noise 302 into the feedback loop of look-ahead modulator 106 but not into the input of look-ahead modulator 106. Thus, loop filter 202 can be modeled as having two separate transfer functions, $H_1(z)$ and $H_2(z)$. The noise transfer function ("NTF") equals $1/[1+z^{-1}*H_2(z)]$. The signal transfer function ("STF") equals $H_1(z)/[1+z^{-1}*H_2(z)]$. In some implementations, H1 and H2 are identical. In the general case, H1 and H2 differ. The choice of implementation affects mainly the STF. For most purposes, the NTF is the critical design criteria, making the choice of H1 less critical.

SUMMARY OF THE INVENTION

In one embodiment of the present invention, a signal processing system includes a pattern biasing look-ahead delta sigma modulator. The pattern biasing look-ahead delta sigma modulator includes a best match generator to determine a best match between an input signal vector and a set of output candidate vectors, wherein at least one of the output candidate vectors is biased to alter a probability of the biased output candidate vector(s) being selected as the best match to the input signal vector.

In another embodiment of the present invention, a method of processing an input signal with a look-ahead delta sigma modulator using at least one biased output candidate vector, wherein the look-ahead delta sigma modulator has a look-ahead depth greater than or equal to 2, includes biasing at least one output candidate vector with a bias factor that alters a probability of each biased output candidate vector being selected by a quantizer to generate quantization output data.

In another embodiment of the present invention, a signal processing system includes a detector to receive a first signal and to detect an outcome probability of prescribed bit patterns, wherein the outcome probability of the prescribed bit patterns is determined by biasing prescribed output candidate patterns used by a look-ahead delta sigma modulator to generate a second signal from which the first signal is derived.

In another embodiment of the present invention, an apparatus to process an input signal includes means for biasing at least one output candidate vector with a bias factor that alters a probability of each biased output candidate vector being selected by a quantizer to generate quantization output data, wherein each output candidate vector includes a potential current output value and at least one future quantization output value. The apparatus also includes means for quantizing the input signal using a set of output candidate vectors that includes the biased output candidate vector.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The nomenclature used in the below description is the same as used in the Background section above unless indicated otherwise.

Look-ahead delta sigma modulators of a signal processing system can selectively bias one or more output candidate vectors to alter the probability of selecting a biased output candidate vector(s) for determination of a quantization output value. The probability, within a range of error, of certain output candidate vectors being selected by a quantizer of the look-ahead delta sigma modulator can be determined. The output candidate vectors determine the quantization output values. Thus, altering the probability of selecting a certain output candidate(s) alters the probability of occurrence of a certain quantization output value(s). Detection of the altered probability allows an output signal to be identified. Identifying an output signal allows for many interesting operations including identifying a specific signal processing system source of the output signal and modifying processing of the output signal. Additionally, some quantization output values can be compressed more densely than others. By altering the probability of occurrence of quantization output values with a bias to achieve higher compression density output values, the collection of quantization output values forming an output signal stream can be compressed more densely. A more densely compressed signal has many advantages including faster transmission and storage with less memory. Thus, biasing an output signal can be used for many interesting purposes including generating more efficiently coded quantization output signals, causing modified processing to occur upon detection of a biased quantization output signal, and identifying data content ownership for intellectual property protection.

The output candidate vectors represent a collection of patterns. Some patterns are substantially similar to other patterns. Accordingly, an output candidate vector(s) that is substantially similar to other output candidate vectors can be biased with a bias value that is sufficient to allow detection of the biased signal and small enough to decrease signal-to-noise ratio by an insignificant amount.

Figure 4:
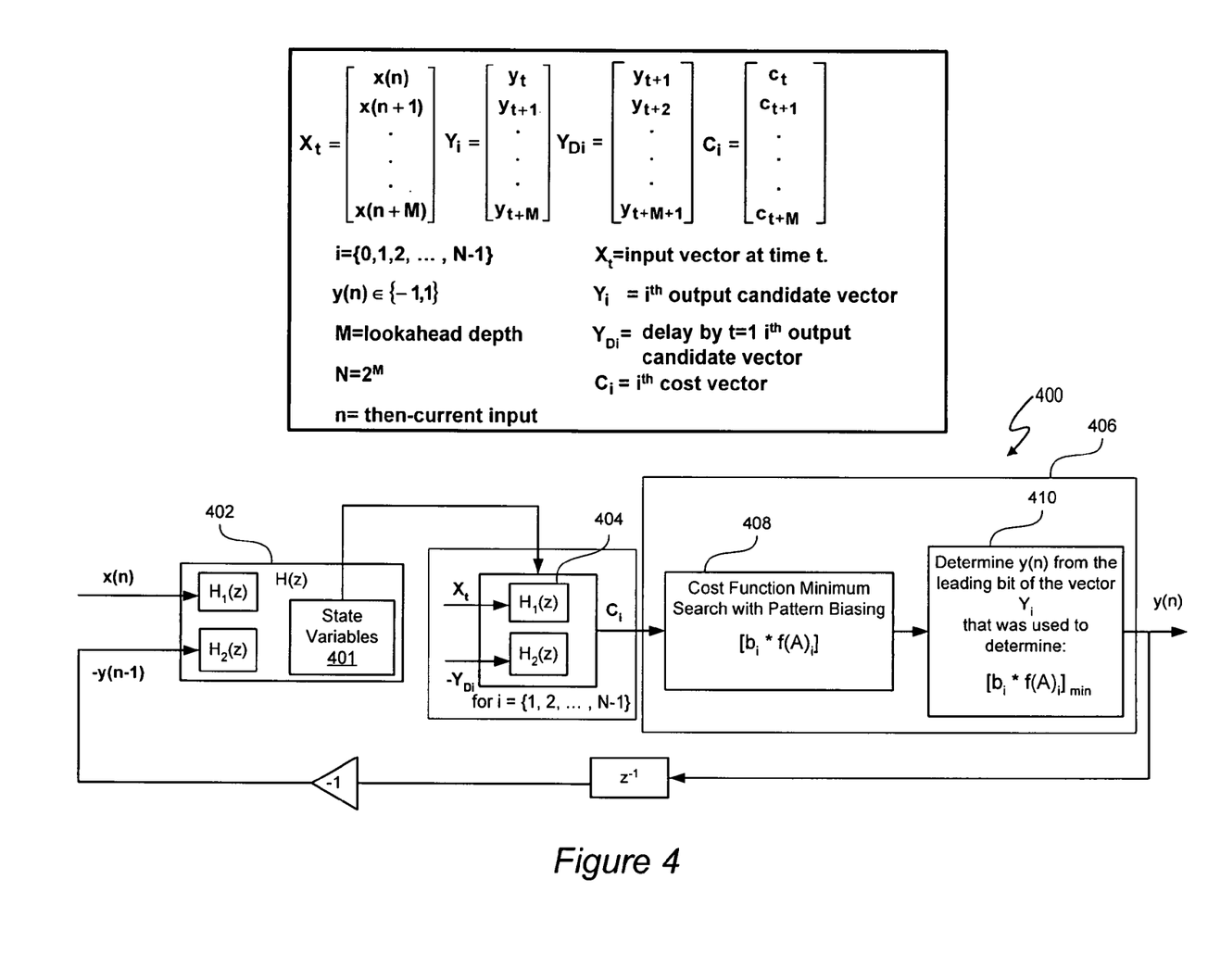
FIG. 4 depicts a pattern biasing look-ahead delta sigma modulator.

FIG. 4 depicts one embodiment of a pattern biasing look-ahead delta sigma modulator 400. The look-ahead delta-sigma modulator 400 processes a discrete-time, over-sampled input signal, X[n], and determines the best output signal Y[n] to approximate X[n] in a prescribed signal bandwidth, $X[n]=x_1, x_2, x_3, \ldots$ and $Y[n]=y_1, y_2, y_3, \ldots$. "Best matching" can be defined as closest matching between an output candidate vector $Y_t$ and an input signal vector $X_t$ in a signal band of interest, $i \in \{0, 1, \ldots, N-1\}$ and $X_t=\{x_t, x_{t+1}, \ldots, x_{t+M-1}\}$. "Closest matching" can be defined, for example, in a power sense (i.e. for each output candidate vector, the power of a difference between a filtered input signal vector and a filtered output candidate vector as affected by weighting or other factors), in a minimum/maximum sense (i.e. for each output candidate vector, a minimum difference between a filtered input signal vector and a filtered output candidate vector as affected by weighting or other factors), in a psycho-acoustically weighted sense, or other desired measure. A "signal band of interest" is, for example, a frequency band containing a signal with data of interest. For example, an audio signal band of interest is approximately 0 Hz to 25 kHz. It will be apparent to those of ordinary skill in the art that the signal processing system described herein can be adapted to determine the best, closest matching output signal pattern under varying constraints and are not limited to the constraints of "best" and "closest matching" set forth herein, but rather constraints can be defined to accomplish desired goals.

Referring to FIG. 4, look-ahead delta-sigma modulator 400 represents an embodiment of a pattern biasing look-ahead delta-sigma modulator that uses quantization error to determine output values. The look-ahead delta-sigma modulator 400 determines each filter output vector $C_i$ for time t in the same manner as look-ahead modulator 106 by applying a filter function to input vector $X_t$ and each negative delayed output candidate vector $-Y_{Di}$, $i \in \{0, 1, \ldots, N-1\}$, M=the look-ahead depth and $N=2^M$. Embodiments of the 400 look-ahead delta sigma modulator 400 bias the patterns represented by the output candidate vectors. In the context of sets, the equals symbol "=" is used interchangeably herein with the traditional "element of" symbol "$\epsilon$". The delay of delayed output candidate vector $Y_{Di}$ is t+x, where x=1 or any other real number determined in accordance with design choices. The number of calculations performed by look-ahead delta-sigma modulator 400 can be reduced using pruning or other computation reduction methods as described in the exemplary commonly assigned U.S. patent application (i) Ser. No. 10/995,731, entitled "Look-ahead Delta Sigma Modulator with Quantization Using Natural and Pattern Loop Filter Responses", filed Nov. 22, 2004, inventor John L. Melanson (referred to herein as "Melanson II Patent") and (ii) U.S. patent application Ser. No. 11/043,719 filed Jan. 26, 2005, "Look-ahead Delta Sigma Modulator with Quantization Using Natural and Pruned Pattern Loop Filter Responses", filed concurrently with this patent application, inventor John L. Melanson (referred to herein as "Melanson III Patent"). The Melanson II Patent and Melanson III Patent are hereby incorporated by reference in their entireties. Pruning techniques include eliminating or reducing processing of redundant cost value vectors and eliminating or reducing redundant arithmetic calculations and pruning of loop filter pattern response vectors.

Look-ahead delta-sigma modulator 400 performs noise shaping on the input signal vector $X_t$ and each negative, delayed output candidate vector $-Y_{Di}$, in accordance with respective loop filter 402 transfer function. In one embodiment, the state variables 401 are updated by loop filter 402 and provided for use by loop filter 404 during determination of each cost vector $C_i$. Loop filter 404 possesses the same topology as loop filter 402. In one embodiment, as described in the Melanson II Patent, loop filter 404 is copied N times to determine each cost vector $C_i$. In one embodiment, loop filters 402 and 404 are identical to loop filter 202(i). In another embodiment, the loop filters 402 and 404 are infinite impulse response filters with multiple look-ahead outputs as described in commonly assigned U.S. patent application Ser No. 11/037,311 entitled "Look-Ahead Delta Sigma Modulator Having an Infinite Impulse Response Filter with Multiple Look-Ahead Outputs", filing date Jan. 18, 2005, inventor John L. Melanson (referred to herein the "Melanson IV Patent"). The Melanson IV Patent is hereby incorporated by reference in its entirety.

Pattern biasing quantizer 406 includes best match generator 408 to process each cost vector $C_i$ to determine the best match between the input signal vector $X_t$ and an output candidate vector $Y_i$. As described above, the output candidate vector $Y_i$ represents the $i^{th}$ pattern of potential current and future quantization output values. Quantizer 406 also includes an output data selection module 508 to select the quantization output value y(n) from the output candidate vector $Y_i$ used to determine the best match. The best match generator 408 minimizes the quantity of $b_i$ times $f(A)_i$. The term "$b_i$" represents the $i^{th}$ bias factor, and the term $f(A)_i$ represents the $i^{th}$ function of A. "f(A)" represents any function used to determine the best match between the input signal vector $X_t$ and the $i^{th}$ output candidate vector $Y_i$ for all i. Exemplary systems and methods can determine the "best matching" output candidate using a variety of techniques. For example, the function $f(A)_i$ can be a conventional function of cost vector $C_i$ for all i as described in the Background section, as described in U.S. patent application Ser. No. 10/875,920, entitled "Signal Processing with a Look-Ahead Modulator Having Time Weighted Error Values", inventor John L. Melanson (referred to herein as the "Melanson V Patent") (e.g. a weighted function of cost vector $C_i$), or as described in the Melanson I Patent (a function using quantization error). The Melanson I Patent and Melanson IV Patent are hereby incorporated by reference in their entireties. Table 3 summarizes examples of f(A).

TABLE 3

| Example f(A) | Source |
| --- | --- |
| f($C_i$) | Background |
| f($C_i - Y_i$) | Melanson II |
| f(w($C_i$)) | Melanson V |
| f(w($C_i - Y_i$)) | Melanson V |

The bias factor "$b_i$" is a factor that biases certain individual quantization output values by biasing the function $f(A)_i$ and, thus, biases output signal Y[n]. The parameters used to determine the value of each bias factor $b_i$ are a matter of design choice. In general, only a limited number of output candidate vectors are actually biased. Output candidate vectors chosen for biasing can be chosen based upon the objective to be obtained by biasing. Output candidate vectors chosen for biasing are generally biased with a biasing factor b that insignificantly affects the signal-to-noise ratio of output signal Y[n]. Generally, applying more biasing to an output candidate vector lowers the signal-to-noise ratio of the output signal Y[n].

Various criteria can be used to determine which output candidate vectors to bias. For example, if detection of a biased output signal for intellectual property purposes, signal encoding source identification purposes, or for other purposes, one criterion for determining which output candidate vector or vectors to bias is identifying an output candidate vector that is substantially similar to other output candidate vectors. The identified output candidate vector can be biased with a bias value that is sufficient to allow detection of the biased signal and small enough to decrease signal-to-noise ratio by an insignificant amount. Larger look-ahead depths provide an increased number of substantially similar output candidate vectors.

Another criterion used to identify an output candidate vector for biasing is identifying an output candidate vector that represents a pattern of quantization output values having a probability of occurrence that is known within a small error range. For example, in an audio or multi-media context, the probability of one pattern of quantization output values occurring relative to another pattern can be known with a high degree of accuracy. For example, 0 level (silence) audio is generally present in statistically significant quantities in almost every audio data stream. 0 level signal is often represented by Pattern A: 110011001100 or Pattern B: 101010101010. The probability of the occurrence of Pattern A has a known probability of occurrence with respect to Pattern B. Thus, a bias $b_i$ can be applied to $f(A)_i$ every time $f(A)_i$ operates on Pattern A or visa versa on Pattern B. The bias factor $b_i$ can be multiplied times $f(A)_i$, added to $f(A)_i$, or applied in any other way to affect the outcome probability of a best match between a selected output candidate vector $Y_i$ and the cost vector $C_i$.

The parameters for choosing a value of each particular bias factor are also a matter of design choice. In general, the value of each bias factor that biases an output candidate vector relative to other output candidate vectors alters the probability of the biased output candidate vector being selected by the best match generator 408 by a sufficient amount to be chosen more or less frequently by the best match generator 408 than would have occurred without biasing. When maintaining an existing signal-to-noise ratio is desirable, the bias factor $b_i$ for the selected output candidate vector $Y_i$ should also be small enough to cause only an insignificant, if any, decrease in the signal-to-noise ratio of the output signal Y[n]. In one embodiment, for unbiased output candidate vectors, the associated bias factor is chosen so as to not alter the probability of selection of the unbiased output candidate vectors. For example, if Pattern A equals $Y_{512}$ and the pattern biasing minimum search function equals [b times $f(A)_i$)], then bias factor $b_{512}$ is set to a non-unity value (either greater than one to increase the probability of occurrence or less than one to decrease the probability of occurrence) and all other bias factors are set to unity, i.e. one (1). In another embodiment, bias factors are simply omitted for non-biased output candidate vectors. The bias can change dynamically during the course of a data stream (e.g. an audio data stream), and the bias can, for example, encode a bit stream that is used to determine ownership.

In another embodiment, particular biased output candidate vectors are chosen as output candidate vectors that have a higher density of compression. For example, at a certain time, a Pattern C may require fewer output bits to encode than a Pattern D. Thus, the Pattern C vector is biased to be selected by the best match generator 408 more frequently than the Pattern D vector. Biasing of one or more particular vectors for compression purposes can also change dynamically with the coefficients of the prediction in the lossless compression algorithm. Exemplary coding techniques for lossless compression of 1-bit audio is described in "Lossless Compression of 1-Bit Audio" by Knapen, Reefam, Janssen, and Bruekers, Journal of Audio Engineering Society, Vol. 52, No. 4, March 2004, pp. 190–199.

The quantization output value y(n) selector module 410 selects the output candidate value y(n) as the leading bit of $Y_i$ from $[b*f(A)_i]_{min}$.

Figure 5:
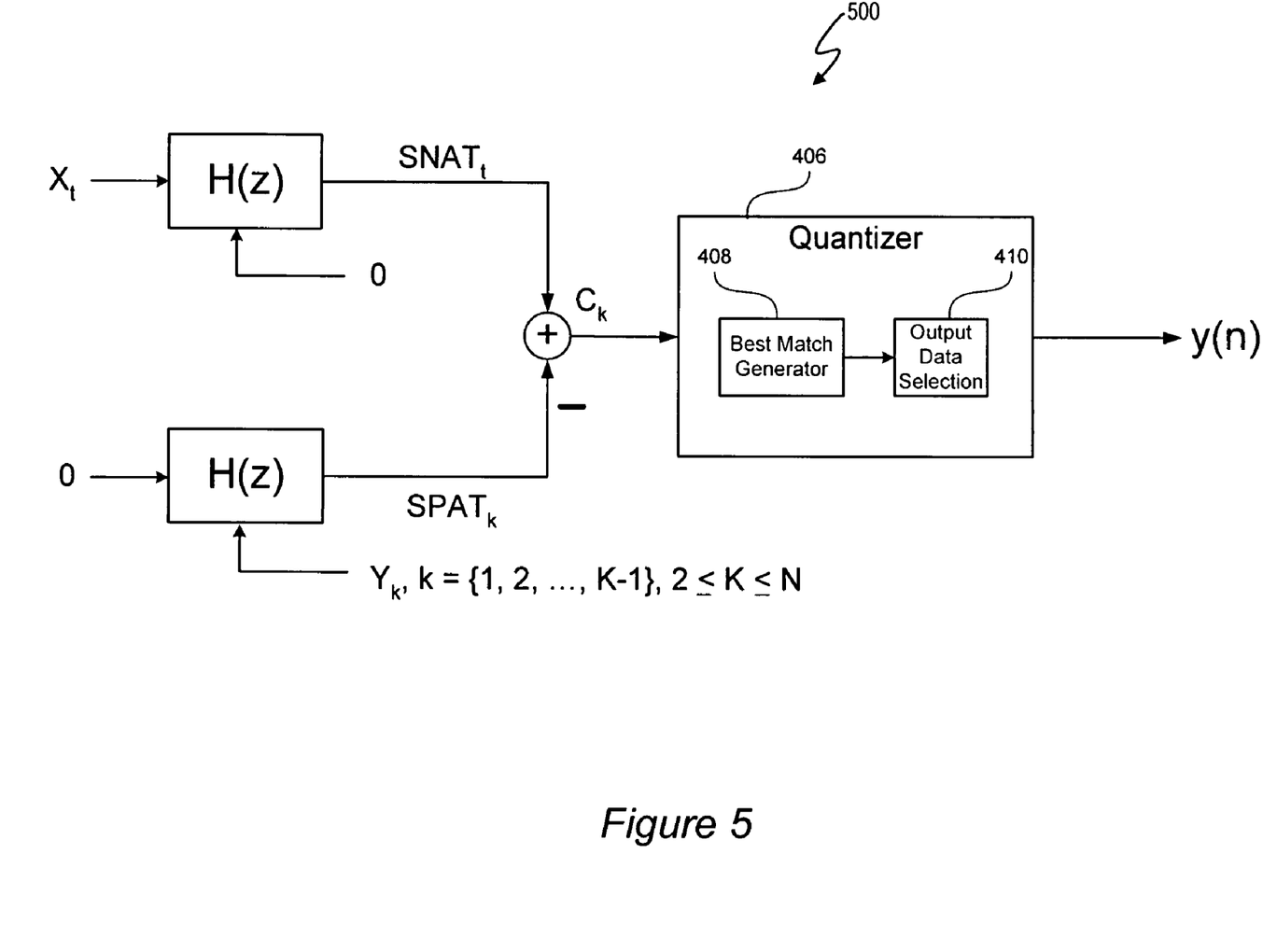
FIG. 5 depicts a pattern biasing look-ahead delta-sigma modulator that uses natural and pruned pattern response vectors to produce a pruned set of cost vectors.
Figure 6:
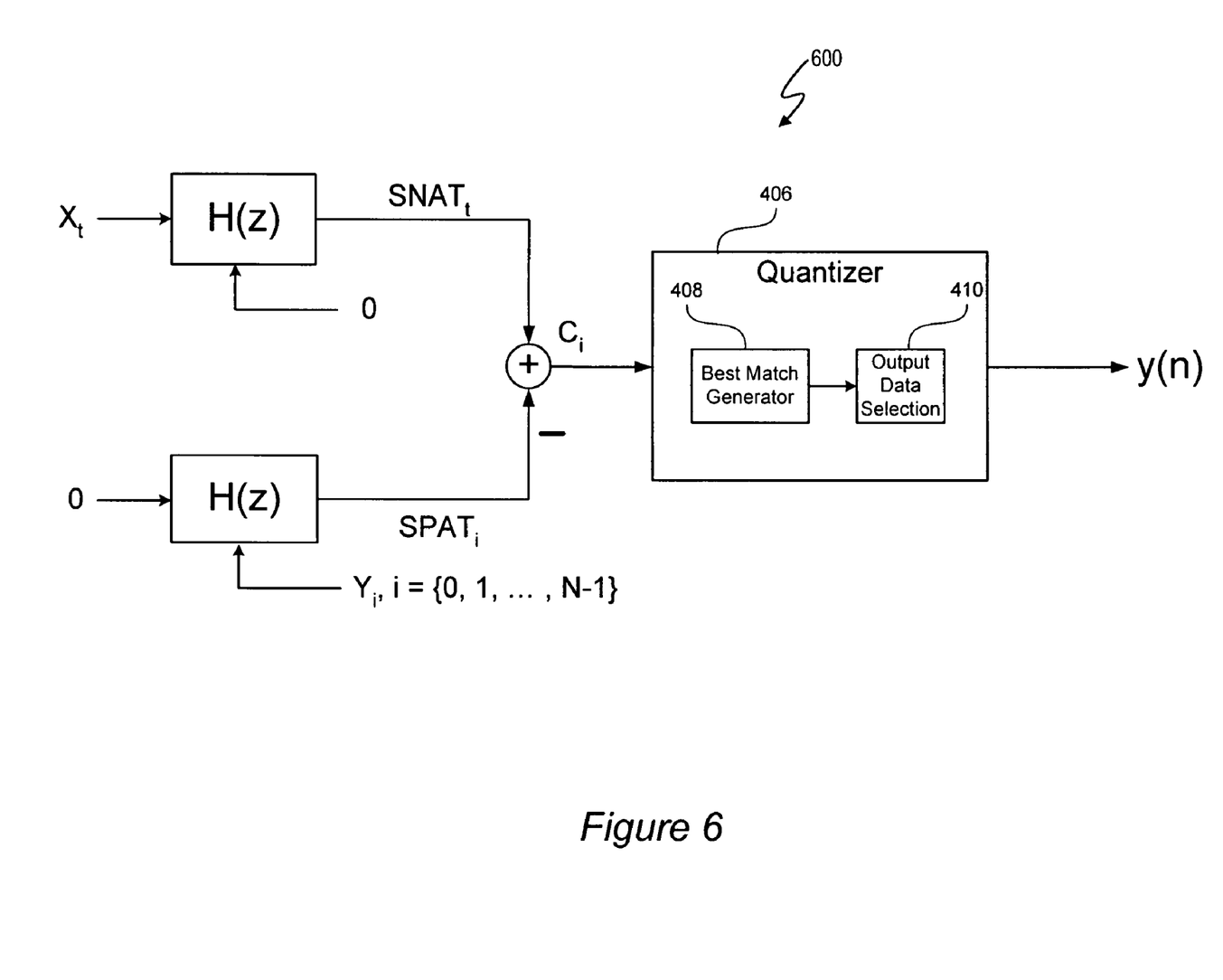
FIG. 6 depicts a pattern biasing look-ahead delta-sigma modulator that uses natural and pattern response vectors to produce a set of cost vectors.

The cost vector $C_i$ can be generated in any number of ways. For example, FIG. 5 depicts a pattern biasing look-ahead delta sigma modulator 500 described in the Melanson III Patent that uses natural and pruned pattern response vectors to produce a pruned set of cost vectors $C_k$ for all k, k∈{0, 1, . . . , K−1}, 2≦K≦N. One or more of the output candidate vectors in the pruned set of output candidate vectors is selected for biasing. FIG. 6 depicts a pattern biasing look-ahead delta sigma modulator 600 described in the Melanson II Patent that uses natural and pattern response vectors to produce a set of cost vectors $C_i$ for all i.

Figures 7, 8:
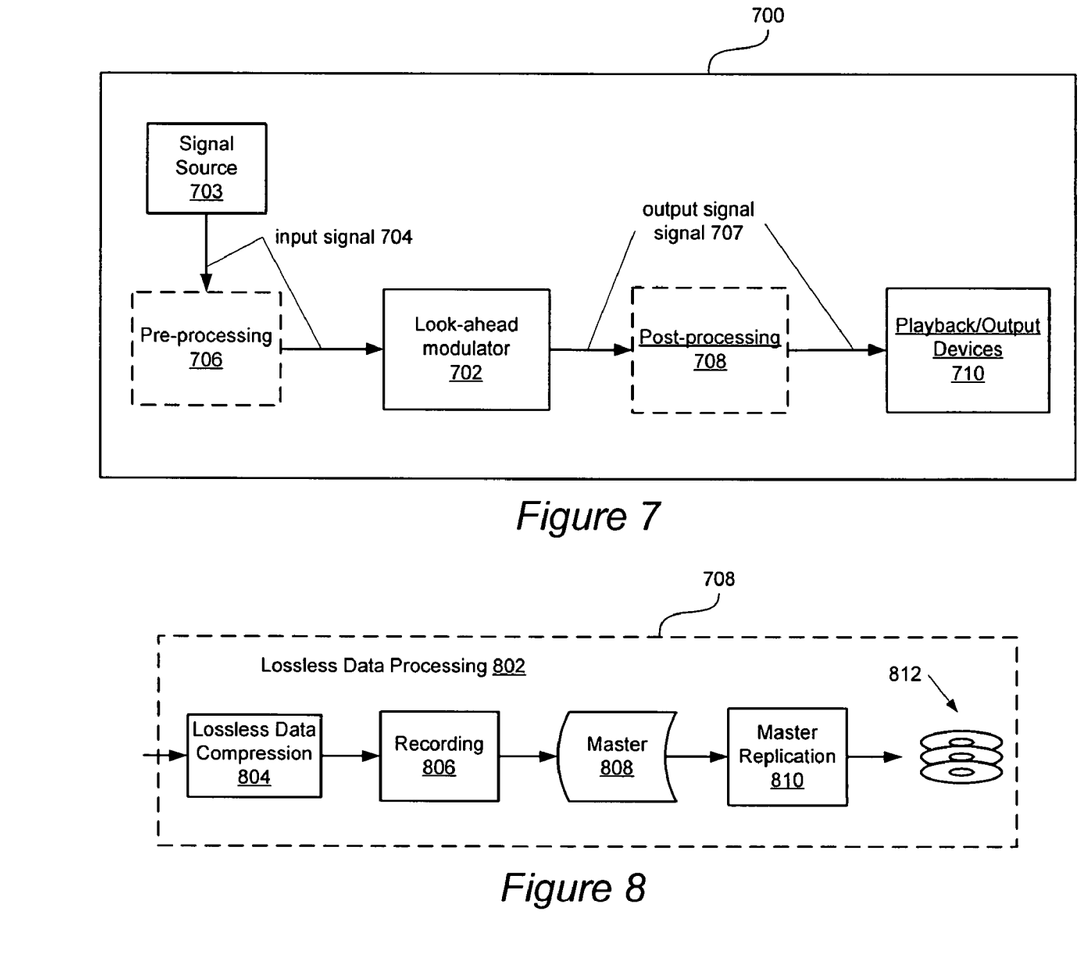
FIG. 7 depicts a signal processing system that includes a look-ahead modulator, an output device and process, and an output medium.
FIG. 8 depicts post-processing operations in an embodiment of the signal processing system of FIG. 7.

Referring to FIG. 7, signal processing system 700 depicts one embodiment of a signal processing system that includes look-ahead modulator 702. Look-ahead delta sigma modulator represents look-ahead delta sigma modulators 400, 500, 600, and any other look-ahead delta sigma modulator that includes a pattern biasing quantizer such as quantizer 406. Signal processing system 700 is particularly useful for high-end audio applications such as super audio compact disk ("SACD") recording applications. Signal processing system 700 processes an input signal 704 generated by an input signal source 703. The input signal 704 may be digital or analog and may be from any signal source including signals generated as part of a recording/mixing process or other high end audio sources or from lower-end sources such as a compact disk player, MP3 player, audio/video system, audio tape player, or other signal recording and/or playback device.

The input signal 704 may be an audio signal, a video signal, an audio plus video signal, and/or other signal type. Generally, input signal 704 undergoes some preprocessing 706 prior to being modulated by look-ahead modulator 702. For example, pre-processing 706 can involve an interpolation filter to oversample a digital input signal 704 in a well-known manner. Pre-processing 706 can include an analog-to-digital converter to convert an analog input signal 704 into a digital signal. Pre-processing 706 can also include mixing, reverberation, equalization, editing, out-of-band noise filtering and other filtering operations.

In the digital domain, pre-processing 706 provides discrete input signals X[n] to look-ahead modulator 702. Each discrete input signal x[n] is a K-bit signal, where K is greater than one. As previously described in more detail, look-ahead modulator 500 processes input signals X[n] and candidates $Y_i$ to determine an output signal 707. Output signal 707 is, for example, a collection of one-bit output values. The output signal 707, thus, becomes an encoded version of the input signal 704.

Referring to FIGS. 7 and 8, signal processing system 700 typically includes post-processing 708 to post-process the output signal 707 of look-ahead modulator 500. Post-processing 708 can include lossless data processing 802. For SACD audio mastering and other audio processing, there is a lossless data compression stage 804. The lossless data compression stage 804 is more efficient when the delta sigma modulator 702 biases higher compression density output candidate vectors to occur more frequently than lower compression density output candidate vectors. The lossless data compression stage 804 is followed by a recording process 806 that produces the actual pits that are burned into a master storage medium 808. The master storage medium 808 is then mechanically replicated using master replication 810 to make the disks (or other storage media) 812 available for widespread distribution. Disks 812 are, for example, any variety of digital versatile disk, a compact disk, tape, or super audio compact disk. Playback/output devices 710 read the data from the disks 812 and provide a signal output in a format perceptible to users. Playback/output devices 710 can be any output devices capable of utilizing the output signal 707. Thus, the storage media 808 and 812 include data encoded using signal modulation processes achieved using look-ahead modulator 500.

Figure 9:
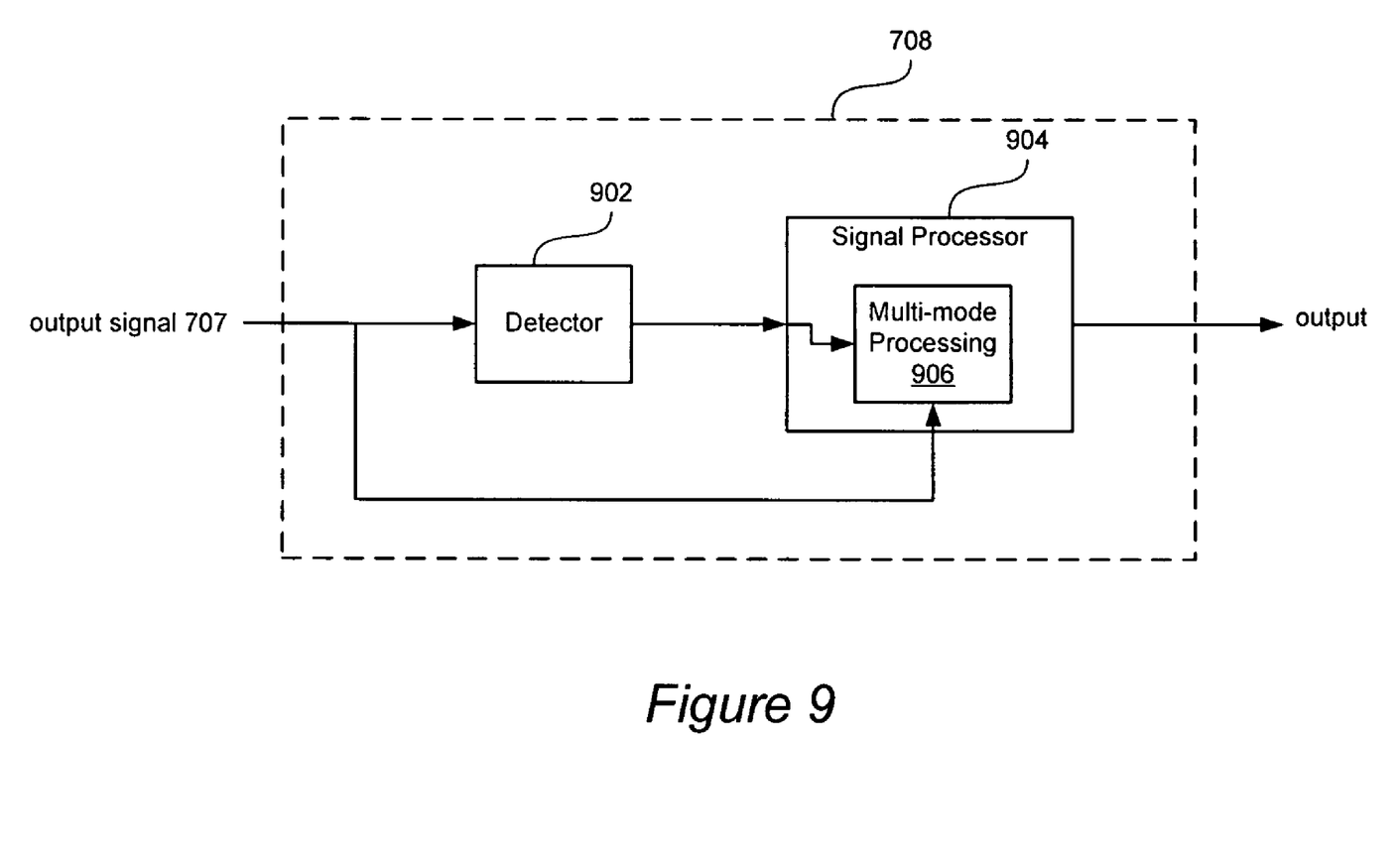
FIG. 9 depicts post-processing operations in an embodiment of the signal processing system of FIG. 7.

Referring to FIG. 9, post-processing 708 can also include a detector to detect a biased output signal from look-ahead delta sigma modulator 902. The detector 902 processes output signal 707 to determine the outcome probability of bit patterns of prescribed output signal 708. If the outcome probability matches the outcome probability as altered by biasing, then the detector 902 can make any number of inferences. For example, the encoding source, i.e. the brand of the system that includes the look-ahead delta sigma modulator 702, can be determined. This information can be used to, for example, process the output signal 707 differently. For example, the identified brand may provide a higher bandwidth signal, so detector 902 informs signal processor 904 that the output signal 707 can be processed using a higher bandwidth setting. The multi-mode processing unit 906 can accordingly adjust the bandwidth settings when processing the output signal 707 to produce a higher quality output. Additionally, if a signal is encoded, decoded, and re-encoded, the biasing will be lost. Thus, another inference that detector 902 can draw from the presence or absence of biasing is whether the output signal 707 has been copied. Detection of copying can protect the intellectual property rights of the owner of the content of output signal 707. If copying is detected, detector 902 could inform signal processor 904 that output signal 707 is an illegitimate copy. The signal processor 904 could instruct the multi-mode processing unit 906 to perform any number of operations, such as, not processing the output signal 707 or perform degraded processing of output signal 707.

Although the present invention has been described in detail, it should be understood that various changes, substitutions and alterations can be made hereto without departing from the spirit and scope of the invention as defined by the appended claims.

What is claimed is:

1. A signal processing system comprising:
   a pattern biasing look-ahead delta sigma modulator, the pattern biasing look-ahead delta sigma modulator comprising:
      a quantizer to determine a quantization output value from a selected output candidate vector, wherein the output candidate vector is selected from a set of output candidate vectors and at least one member of the set of output candidate vectors is biased to alter a probability of the biased output candidate vectors being selected by the quantizer.

2. The signal processing system of claim 1 wherein the quantizer comprises a best match generator to determine a best match between an input signal vector and a set of output candidate vectors, wherein at least one of the output candidate vectors is biased to alter a probability of the biased output candidate vector(s) being selected as the best match to the input signal vector.

3. The signal processing system of claim 2 further comprising:
   a filter to filter the input signal vector and each output candidate vector; and
   wherein the best match between the input signal vector and a set of output candidate vectors is determined from the lowest power between a filtered input signal vector and each respective filtered output candidate vector.

4. The signal processing system of claim 1 further comprising:
   a quantizer to quantize the input signal vector using the output candidate vector that best matches the input signal vector.

5. The signal processing system of claim 1 wherein each biased output candidate vector is biased using a bias factor multiplier.

6. The signal processing system of claim 1 wherein each biased output candidate vector is biased using a biasing factor, and a value of the bias factor is chosen to alter the probability of a selected biased output candidate vector sufficiently to allow detection of the altered probability while causing at most an insignificant change in signal-to-noise ratio.

7. The signal processing system of claim 1 further comprising:
a detector to detect biasing of an output signal derived from the quantized input signal, wherein the output signal is biased in accordance with selection by the quantizer of at least one biased output candidate vector.

8. The signal processing system of claim 1 wherein at least one of the biased output candidate vectors is chosen for biasing on the basis that each output candidate vector chosen for biasing is more densely compressible than substantially similar output candidate vectors.

9. The signal processing system of claim 1 wherein at least one biased output candidate vector has a known probability of selection by the quantizer relative to a probability of selection of another output candidate vector.

10. The signal processing system of claim 1 wherein to alter a probability of the biased output candidate vector(s) being selected comprises to increase the probability of the biased output candidate vector(s) being selected.

11. The signal processing system of claim 1 further comprising:
signal processing and recording equipment to process output data from the quantizer and record the processed output data on storage media.

12. The signal processing system of claim 1 wherein the input signal comprises audio input signal data.

13. The signal processing system of claim 1 wherein each output candidate vector includes a potential current quantization output value and at least one potential future quantization output value.

14. A method of processing an input signal with a look-ahead delta sigma modulator using at least one biased output candidate vector, wherein the look-ahead delta sigma modulator has a look-ahead depth greater than or equal to 2, the method comprising:
biasing at least one output candidate vector with a bias factor that alters a probability of each biased output candidate vector being selected by a quantizer to generate quantization output data.

15. The method of claim 14 wherein biasing at least one output candidate vector further comprises:
biasing output candidate vectors on the basis that each output candidate vector chosen for biasing is more densely compressible than substantially similar output candidate vectors.

16. The method of claim 14 wherein biasing at least one output candidate vector further comprises:
biasing an output candidate vector having a known probability of selection by the quantizer relative to a probability of selection of another output candidate vector.

17. The method of claim 14 wherein biasing at least one output candidate vector using a bias factor comprises multiplying each biased output candidate vector by the bias factor.

18. The method of claim 14 wherein the bias factor is chosen to alter the probability of a selected biased output candidate vector sufficiently to allow detection of the altered probability while causing at most an insignificant change in signal-to-noise ratio.

19. The method as in claim 14 wherein the input signal data sample comprises audio input signal data.

20. The method of claim 14 further comprising:
quantizing the input signal using a set of output candidate vectors that includes the biased output candidate vector.

21. The method as in claim 20 further comprising:
recording quantized input signal data on storage media.

22. A signal processing system comprising:
a detector to receive a first signal and to detect an outcome probability of prescribed bit patterns, wherein the outcome probability of the prescribed bit patterns is determined by biasing prescribed output candidate patterns used by a look-ahead delta sigma modulator to generate a second signal from which the first signal is derived.

23. The signal processing system as in claim 22 wherein the first signal includes audio data content.

24. An apparatus to process an input signal, the apparatus comprising:
means for biasing at least one output candidate vector with a bias factor that alters a probability of each biased output candidate vector being selected by a quantizer to generate quantization output data, wherein each output candidate vector includes a potential current output value and at least one future quantization output value; and
means for quantizing the input signal using a set of output candidate vectors that includes the biased output candidate vector.

* * * * *